(12) United States Patent
Jan et al.

(10) Patent No.: US 11,397,226 B2
(45) Date of Patent: Jul. 26, 2022

(54) FERROMAGNETIC RESONANCE (FMR) ELECTRICAL TESTING APPARATUS FOR SPINTRONIC DEVICES

(71) Applicant: Taiwan Semiconductor Manufacturing Company, Ltd., Hsinchu (TW)

(72) Inventors: Guenole Jan, San Jose, CA (US); Son Le, Gilroy, CA (US); Luc Thomas, San Jose, CA (US); Santiago Serrano Guisan, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/008,228

(22) Filed: Aug. 31, 2020

(65) Prior Publication Data
US 2020/0393525 A1     Dec. 17, 2020

Related U.S. Application Data

(62) Division of application No. 15/875,004, filed on Jan. 19, 2018, now Pat. No. 10,761,154.

(51) Int. Cl.
*G01R 33/24* (2006.01)
*G01N 24/10* (2006.01)
(Continued)

(52) U.S. Cl.
CPC .............. *G01R 33/24* (2013.01); *G01N 24/00* (2013.01); *G01N 24/10* (2013.01); *G01R 33/60* (2013.01)

(58) Field of Classification Search
CPC ...... G01R 33/24; G01R 33/60; G01R 33/345; G01N 24/10; G01N 24/00; G01N 22/00
See application file for complete search history.

(56) References Cited

U.S. PATENT DOCUMENTS 4,286,216 A    8/1981   Auld et al.
4,340,861 A    7/1982   Sparks
(Continued)

FOREIGN PATENT DOCUMENTS

CN    106323994 A   *   1/2017
CN    106872917 A   *   6/2017
(Continued)

OTHER PUBLICATIONS

Dragos I. Mircea, et al., "Near-field microwave probe for local ferromagnetic resonance characterization," Applied Physics Letters, vol. 90, No. 14,142504, pp. 1-3, 2007.4.2 Dec. 23, 2006.
(Continued)

*Primary Examiner* — Patrick Assouad
*Assistant Examiner* — Demetrius R Pretlow
(74) *Attorney, Agent, or Firm* — Haynes and Boone, LLP

(57) ABSTRACT

A scanning ferromagnetic resonance (FMR) measurement system is disclosed with a radio frequency (RF) probe and one or two magnetic poles mounted on a holder plate and enable a perpendicular-to-plane or in-plane magnetic field, respectively, at test locations. While the RF probe tip contacts a magnetic film on a whole wafer under test (WUT), a plurality of microwave frequencies ($f_R$) is sequentially transmitted through the probe tip. Simultaneously, a magnetic field ($H_R$) is applied to the contacted region thereby causing a FMR condition in the magnetic film for each pair of ($H_R$, $f_R$) values. RF output signals are transmitted through or reflected from the magnetic film to a RF diode and converted to voltage signals which a controller uses to determine effective anisotropy field, linewidth, damping coefficient, and/or inhomogeneous broadening for a sub-mm area. The WUT is moved to preprogrammed locations to enable multiple FMR measurements at each test location.

20 Claims, 7 Drawing Sheets

(51) Int. Cl.
*G01R 33/60* (2006.01)
*G01N 24/00* (2006.01)

(56) References Cited

U.S. PATENT DOCUMENTS

| | | | |
|---|---|---|---|
| 4,364,012 | A | 12/1982 | Auld |
| 4,465,974 | A | 8/1984 | Sparks |
| 5,041,782 | A | 8/1991 | Marzan |
| 5,889,402 | A * | 3/1999 | Kumatoriya ......... G01R 33/345 324/321 |
| 6,376,836 | B1 | 4/2002 | Anlage et al. |
| 7,417,442 | B2 | 8/2008 | Hachisuka et al. |
| 7,545,139 | B2 | 6/2009 | Saruki et al. |
| 7,598,898 | B1 * | 10/2009 | Funk ....................... G01S 7/003 342/175 |
| 8,959,980 | B2 | 2/2015 | Vodnick et al. |
| 9,030,216 | B2 | 5/2015 | Lamson et al. |
| 2002/0135443 | A1 | 9/2002 | Watanabe et al. |
| 2003/0193333 | A1 | 10/2003 | Barbie |
| 2006/0160136 | A1 * | 7/2006 | Xiang ............... G01R 33/34053 435/7.1 |
| 2006/0222835 | A1 * | 10/2006 | Kudo .................. H01F 10/3268 428/212 |
| 2007/0187513 | A1 | 8/2007 | Marin Palacios et al. |
| 2009/0147389 | A1 | 6/2009 | Taratorin et al. |
| 2009/0212769 | A1 | 8/2009 | Stoica et al. |
| 2010/0023294 | A1 | 1/2010 | Fan et al. |
| 2010/0079908 | A1 | 4/2010 | Heidmann |
| 2011/0109406 | A1 | 5/2011 | Gregg et al. |
| 2012/0326712 | A1 * | 12/2012 | Tudosa ................ G01R 33/093 324/252 |
| 2014/0070800 | A1 | 3/2014 | Cho et al. |
| 2014/0097841 | A1 * | 4/2014 | Yang ....................... G01R 33/60 324/316 |
| 2016/0372212 | A1 | 12/2016 | Kishi |
| 2019/0049514 | A1 * | 2/2019 | O'Brien ............. G01R 31/2831 |
| 2019/0102585 | A1 | 4/2019 | Modiano et al. |
| 2019/0227132 | A1 | 7/2019 | Jan et al. |

FOREIGN PATENT DOCUMENTS

| | | | |
|---|---|---|---|
| DE | 112018001461 T5 | 12/2019 | |
| EP | 0751399 A1 * | 1/1997 | .............. H01P 1/215 |
| EP | 0501478 B1 * | 7/1998 | .............. G11B 5/33 |
| EP | 1325346 B1 | 12/2006 | |
| JP | H0641970 B2 * | 6/1994 | |
| JP | 2015206641 A * | 11/2015 | |
| RU | 2347296 C1 * | 2/2009 | |
| SU | 1185258 A1 * | 10/1985 | |
| WO | WO-2018070934 A1 * | 4/2018 | .............. G01N 24/00 |

OTHER PUBLICATIONS

Bilzer, C. et al., "Vector network analyzer ferromagnetic resonance of thin films on coplanar waveguides: Comparison of different evaluation methods", AIP Journal of Applied Physics 101, 074505 (2007), Apr. 12, 2007, American Institute of Physics, http://dx.doi.org/10.1063/1.2716995, 5 pages.

Bilzer, C. et al., "Open-Circuit One-Port Network Analyzer Ferromagnetic Resonance", IEEE Transactions on Magnetics, vol. 44, No. 11, Nov. 2008, pp. 3265-3268.

Bilzer, Claus, "Microwave susceptibility of thin ferromagnetic films: metrology and insight into magnetization dynamics", Jan. 8, 2008, Universite Paris Sud—Paris XI, 2007, Chapter 2.1.1, 2.1.2, 13 pages.

* cited by examiner

US 11,397,226 B2

FERROMAGNETIC RESONANCE (FMR) ELECTRICAL TESTING APPARATUS FOR SPINTRONIC DEVICES

PRIORITY DATA

The present application is a divisional application of U.S. patent application Ser. No. 15/875,004, filed on Jan. 19, 2018, which is herein incorporated by reference in its entirety.

RELATED PATENT APPLICATION

This application is related to Ser. No. 15/463,074, filing date Mar. 20, 2017; which is assigned to a common assignee and is herein incorporated by reference in its entirety.

TECHNICAL FIELD

The present disclosure relates to a system for measuring magnetic properties in magnetic films and structures in regions as small as sub-millimeter in diameter, and a method for doing the same, and in particular, to a magnetic assembly and RF probe that are mounted on a platform and installed in an electrical probe station to enable fully automated FMR testing of films and structures across entire wafers without a need to cut the wafers in engineering or manufacturing environments.

BACKGROUND

Magnetic thin films and multilayers play a key role in various types of magnetic storage devices such as a magnetic hard disk (HDD) drive, Magnetic Random Access Memory (MRAM), spin torque oscillator (STO), and magnetic domain wall devices. In order to develop and optimize such devices, monitoring and characterization of magnetic thin film stacks are necessary. A variety of different magnetic characterization techniques must be used to determine all the essential magnetic parameters such as crystalline anisotropy, surface or interface anisotropy, magnetization saturation (Ms), damping constant ($\alpha$), gyromagnetic ratio ($\gamma$), inhomogeneous broadening, resistance×area product (RA), and magnetoresistive ratio (MR).

FMR is a well-established method of measuring anisotropy fields, as well as the gyromagnetic ratio $\gamma$, and the damping constant $\alpha$ of magnetic films and multilayers in extended unpatterned films or over an area comprising a large array of sub-micron patterned structures. The resonance frequency $f_R$ of a ferromagnetic film is given by the so-called Kittel formula shown in equation (1) below where $H_R$ is the resonance field applied perpendicular to the plane of the film, $H_K$ is the effective anisotropy field which includes structural, surface, and magnetostatic contributions, and $\gamma$ is the gyromagnetic ratio.

$$2\pi f_R = \gamma(H_R + H_K) \quad \text{(Eq. 1)}$$

A FMR experiment is performed by probing the magnetic system (thin film, multilayer stack, or structured device) with a combination of microwave excitation and a quasi-static magnetic field. FMR data is obtained by either sweeping the magnetic field at a constant microwave frequency, or by sweeping the frequency at a constant field. When the ferromagnetic resonance condition is achieved, it may be detected by an enhanced absorption of the microwave (RF signal) by the ferromagnetic sample. Thus, resonance (FMR) conditions are defined with pairs of magnetic field and microwave frequency values ($H_R$, $f_R$).

There are several ways of submitting a ferromagnetic sample to microwave excitation. Historically, FMR experimental conditions employed tubular waveguides, and samples were placed in a resonant cavity between poles of an electromagnet. More recently, new methods have been developed that are well suited to analyze film shaped samples. In particular, the wafer under test (WUT) is placed in contact with a non-magnetic waveguide transmission line (WGTL) that may be in the form of a grounded coplanar waveguide (GCPWG), coplanar waveguide (CPWG), co-axial waveguide (CWG), stripline (SL), or a microstrip (MS). The power transmitted or reflected by the WGTL is monitored as a function of the applied magnetic field and microwave frequency.

Referring to FIG. 1a, a schematic depiction is shown where output voltages are plotted as a function of a variable magnetic field at constant microwave frequency (f) using five different values (f1-f5) of microwave frequency. The center and width of the Lorentzian peaks is extracted from the data as a function of the excitation frequency. As mentioned previously, the center field is the resonance field ($H_R$), which is related to the excitation frequency following the Kittel formula that is rewritten in a slightly different form in equation (2) below where h is the Planck constant and $\mu_B$ is the Bohr magneton.

$$H_R(f) = [h/(\gamma \times \mu_B)] \times f - H_K \quad \text{(Eq. 2)}$$

The variation of $H_R$ with microwave frequency is shown in FIG. 1b where each of the points along curve 21 is derived from one of the Lorentzian shaped peaks Hr1-Hr5 in FIG. 1a. As indicated by equation (2), the extrapolation of the data to f=0 gives the value of the effective anisotropy field $H_K$.

The linewidth L of the resonance peak is the width at half amplitude $\Delta H$ of the resonance peak and is related to dissipative processes involved in magnetization dynamics.

The linewidth depends on the excitation frequency and the dimensionless Gilbert damping constant $\alpha$ according to equation (3) below where $L_0$ is an inhomogeneous broadening. By fitting $H_R$ and L with respect to the excitation frequency $f_R$, $H_K$ as well as $\alpha$ and $\gamma$ may be derived.

$$L(f) = (2h\alpha/\gamma \times \mu_B)f + L_0 \quad \text{(Eq. 3)}$$

A network analyzer for detecting FMR in thin CoFe and CoFeB films on a coplanar waveguide is described by C. Bilzer et al. in "Vector network analyzer ferromagnetic resonance of thin films on coplanar waveguides: Comparison of different evaluation methods" in J. of Applied Physics, 101, 074505 (2007), and in "Open-Circuit One-Port Network Analyzer Ferromagnetic Resonance" in IEEE Trans. Magn., Vol. 44, No. 11, p. 3265 (2008). In these experiments, the planar WGTL is typically attached to radiofrequency (RF) connectors by microwave electrical probes and placed between the poles of an electromagnet. Thus, given the size of the WGTL (about 5 mm long), and the size of the gap of typical electromagnets, only small size samples (normally <1 inch in diameter) can be measured. Accordingly, wafers typically used in the microelectronics industry (having diameters of 6, 8, 12 inches or more) can only be measured with this FMR technique if they are cut into small coupons.

FIG. 2 is reproduced from "Microwave susceptibility of thin ferromagnetic films: metrology and insight into magnetization dynamics", Claus Bilzer, Ph.D. report, Universite Paris Sud—Paris XI, 2007) and depicts a conventional FMR system. Vector network analyzer (VNA) 10 is connected from one port through a first coaxial cable 1 to a first microwave probe portion 2a that is attached to coplanar waveguide (CPWG) 6. A top surface of the CPWG adjoins a magnetic film 4 mounted on a substrate. When a microwave frequency from probe 2a and an external magnetic field 3 are applied in an x-axis direction across the magnetic film, an output signal in a transmission mode passes into a second microwave probe portion 2b and then through a second coaxial cable 5 before returning to the VNA at a second port. Magnetic film size b is typically restricted to 1 inch or less, which means the magnetic film sample 4 must be cut from a whole wafer.

Since conventional FMR techniques are destructive, time consuming, and limited to measuring large structures having a cross-sectional size substantially greater than 1 mm, they are undesirable to an extent that prevents wide acceptance of FMR as a characterization tool in the magnetic data storage industry. An improved FMR measurement system and technique is needed that enables fully automated measurements on whole wafers for faster throughput and lower cost. Preferably, the FMR system may be constructed from commercially available parts. Also, the improved FMR technique should be able to measure magnetic properties in portions of films having a diameter of less than 1 mm to enable smaller test structures to be measured than is possible in the prior art.

SUMMARY

One objective of the present disclosure is to provide a fully automated system for FMR measurements so that magnetic structures smaller than 1 mm in lateral size may be monitored and characterized across an entire wafer without cutting the wafer to prepare test samples.

A second objective of the present disclosure is to provide a fully automated system according to the first objective that may be readily assembled from commercially available components.

A third objective of the present disclosure is to provide a FMR measurement system that enables a more uniform magnetic field to be applied to the wafer under test thereby improving the reliability of data acquisition during measurements.

These objectives are achieved according to one embodiment of the present disclosure with a scanning FMR measurement system that is configured around a controller (computer) linked to an electrical probe station. The electrical probe station comprises a RF probe with a first connector that is linked to a RF generator, and a second connector that is linked to a RF power detector (diode). The RF probe is attached to a chassis that is mounted on a holder plate such that during FMR measurements, the RF probe tip contacts a portion of a magnetic structure to be measured on a wafer under test (WUT). The RF probe tip consists of two sets of probes arranged in a GSSG pattern according to one embodiment where G is ground, and S is a signal pathway. As the RF probe tip contacts the magnetic structure on the WUT, a magnetic field is applied to the contacted region and is generated from a magnetic pole that is also mounted on the holder plate above the RF probe. A wafer chuck holds the WUT stationary during a measurement and is programmed to move laterally such that a plurality of different locations on the WUT may be monitored or tested during subsequent measurements.

In another embodiment, the magnetic assembly comprises two magnetic poles that are positioned on either side of the RF probe thereby providing an in-plane magnetic field to the magnetic film during a RF measurement. The magnetic poles are preferably proximate to the magnetic film on the WUT but are not contacting a top surface thereof.

According to one embodiment that represents a RF transmission mode for performing the FMR measurements, a RF source is linked to an active frequency doubler, which is attached through a RF input cable to the first connector on the RF probe. Thus, a RF signal passes through a first signal (S) pathway in the probe tip while a magnetic field is applied to the magnetic structure contacted by the RF probe tip. When the RF current excites the magnetic layers in the test structure, there is a power loss that is detected by a RF diode, which is linked to the second connector on the RF probe through a RF output cable. In other words, the RF current passes through the test structure and then exits through a second S pathway to the RF output cable. The RF diode is linked to an analog-to-digital converter (ADC), which transmits the data acquired from the RF diode to a controller (computer). The transmitted power through the test structure is measured for different applied RF frequencies as a function of applied field.

In an alternative embodiment that is a reflectance FMR measurement mode, the components in the first embodiment are retained except a directional coupler is inserted in the RF circuit between the frequency doubler and RF probe. Secondly, only one S pathway in the RF probe tip is necessary since the input RF current and output RF current pass through the same S pathway to and from the directional coupler. The output RF current is sent from the directional coupler to the RF diode and then to the ADC.

In all embodiments disclosed herein, the controller directs the wafer chuck and WUT to move in an x-axis and/or y-axis direction parallel to the plane of the WUT top surface such that the RF probe is aligned above a predetermined (x, y) coordinate (test site) on the WUT. The RF probe is separated from a magnetic structure or film on the WUT by a gap distance during a time period between a first measurement and a second measurement. At each test site, the wafer chuck and WUT are raised such that the probe tip makes contact with a magnetic structure at the beginning of a FMR measurement. At the end of each measurement, the WUT and wafer chuck are lowered to reestablish a gap between the magnetic film and the probe tip. Thus, the FMR measurement sequence comprises a "step and repeat" pattern in which the wafer chuck and WUT are moved laterally (stepped) to align the magnetic pole and RF probe above a new (x, y) coordinate on the WUT, raised so that the magnetic structure contacts the RF probe tip, and then lowered to the gap distance after the measurement. The area of the contacted region on the magnetic structure is preferably less than 1 mm in diameter in order to detect Hk and α for magnetic devices with a size of that order of magnitude.

In all embodiments, the RF probe transmits a sequence of microwave frequencies (RF input signals) to the wafer. A FMR condition is established in the contacted magnetic structure with each applied microwave frequency, and the extent of microwave (RF) absorption by the magnetic structure is dependent on the magnitude of the RF frequency, the applied magnetic field, and the magnetic properties in the magnetic structure. As a result of FMR absorption by the magnetic structure, there is a power loss between the input RF signal and the output RF signal that is detected by the RF power diode. The ADC converts each RF output signal to a voltage readout that the controller uses to determine Hk, and α, for example, for the magnetic structure.

Since a single controller may be employed to manage all aspects of the testing including wafer chuck and mounting plate movement, RF signal processing, magnetic field generation, and compilation of the test data, throughput is optimized so that the system and scanning FMR measurement method are said to be fully automated, and may be readily implemented in an engineering or production environment. Moreover, the RF probe, magnetic assembly, mounting plate, and RF circuit components are commercially available and may be readily configured to provide a reliable scanning FMR measurement system.

BRIEF DESCRIPTION OF THE DRAWINGS

FIG. 1b shows a plot of resonance field ($H_R$) as a function of the microwave frequencies used in FIG. 1a.

DETAILED DESCRIPTION

The present disclosure is a scanning FMR system that is designed to measure magnetic properties including $H_K$ and α for magnetic structures that may be substantially smaller than 1 mm in diameter. Multiple test sites across a whole wafer are sequentially measured with either a RF transmission mode or a RF reflectance mode. X-axis and y-axis coordinates on the wafer under test (WUT) are in a plane that is aligned parallel to and above the plane of the wafer chuck. The present disclosure also encompasses a FMR test method for measuring magnetic properties of one or more magnetic films on unpatterned wafers or in device structures. The terms "RF" and "microwave" may be used interchangeably.

In related U.S. patent application Ser. No. 15/463,074, we disclosed a FMR measurement system that relies on a waveguide transmission line (WGTL) that is attached to RF input and RF output connectors and is capable of taking measurements at a plurality of sites on a whole wafer. However, the WGTL is generally custom designed and requires the positioning of the WGTL as close as possible to the WUT to improve the coupling and magnetic field at the device level. Furthermore, the area probed in the measurement is quite large (mm to cm diameter) compared with sub-micron dimensions in the device structures. Now, we have discovered an improved scanning FMR measurement system that may be entirely constructed from commercially available components, and enables magnetic properties to be monitored and measured in smaller structures that may be substantially less than 1 mm in diameter.

Figure 3:
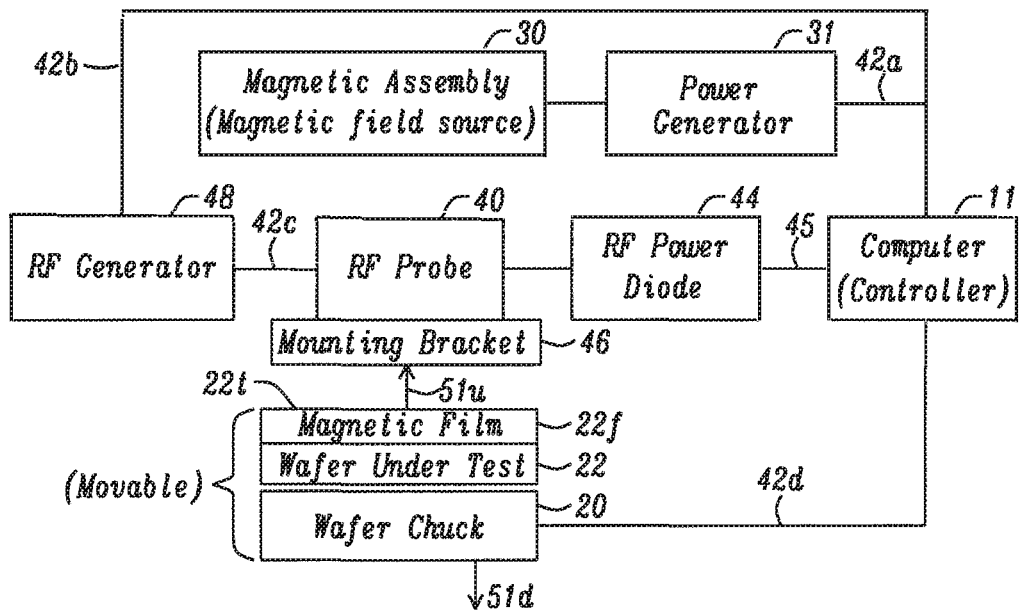
FIG. 3 is a diagram showing the various components of a fully automated FMR measurement system according to a first embodiment of the present disclosure.

Referring to FIG. 3, one embodiment of a scanning FMR measurement system according to the present disclosure is depicted in a diagram that shows the layout of the key components. There is a computer hereafter called the controller 11 to manage the movement of the prober stage also known as wafer chuck 20, and WUT 22 on which the magnetic film 22f to be tested is formed. It should be understood that the term "magnetic film" may refer to one layer, a plurality of magnetic layers formed in a stack of layers, or a plurality of magnetic structures such as magnetic tunnel junction (MTJ) cells on the WUT. The WUT is held on a top surface of the wafer chuck by a vacuum, and the wafer chuck and WUT are moved in a programmed manner while the magnetic assembly and RF probe are maintained in a stationary position on a holder plate. However, the present disclosure also anticipates that the WUT and wafer chuck may be stationary while the magnetic assembly and RF probe attached to the holder plate are movable.

A magnetic field in magnetic assembly 30 (comprised of at least one magnetic field source) is produced by power input from the power generator 31 when instructed to do so by the controller through link 42a. In preferred embodiments, a magnetic field is applied to a predetermined ($x_n$, $y_n$) coordinate on the WUT while a RF signal pathway in the RF probe 40 on mounting bracket 46 contacts a top surface 22t of the magnetic film at the ($x_n$, $y_n$) coordinate. As a result of simultaneously applying a microwave frequency (RF input signal) from the RF probe, and a magnetic field of up to 3 Tesla from a pole tip (shown in FIG. 5) on the magnetic assembly, a ferromagnetic resonance (FMR) condition is established in the magnetic film proximate to the predetermined ($x_n$, $y_n$) coordinate on the WUT. In other embodiments (not shown), the magnetic field may be applied from a magnetic field source using an extension thereof that is not in the shape of a pole tip.

The RF detector may be a power diode 44 hereinafter referred to as a RF diode, which detects a RF output signal transmitted from the magnetic film and that exits the RF probe through a second signal pathway and second RF connector (not shown). Each RF output signal corresponds to a RF power loss caused by the FMR condition where a certain amount of microwave power is absorbed and excites the magnetic film to a resonance state. Each FMR measurement may comprise a plurality of RF input signals each corresponding to a different RF frequency. After the FMR measurement is performed at the ($x_n$, $y_n$) coordinate, the wafer chuck 20 and WUT 22 are lowered 51d via a signal from the controller 11 through link 42d to reestablish a gap distance below the RF probe. Subsequently, the wafer chuck and WUT are moved to another predetermined ($x_n$, $y_n$) coordinate, and then the wafer chuck is raised 51u to enable the RF probe to contact magnetic film top surface 22t for another FMR measurement.

The controller 11 has an electrical connection 42b to a RF generator 48 that provides a plurality of microwave frequencies through link 42c to a first RF connector (not shown) on RF probe 40. In some embodiments, the RF generator produces a first microwave frequency (f1) in the range of 1 to 20 GHz. However, the present disclosure anticipates inserting a frequency multiplier module (not shown) between the RF generator and RF probe that adjusts f1 to a second RF frequency (f2) where f2>f1. For example, when f1=20 GHz, the frequency multiplier module may be an active frequency doubler that adjusts f1 to f2 where f2=40 GHz. According to the first embodiment, RF frequencies below 1 GHz are not practical for the purpose of inducing a FMR condition in the magnetic film.

In a preferred operating mode for a FMR measurement, the applied magnetic field is varied (swept from a minimum to a maximum value) at a constant microwave frequency. The FMR measurement is preferably repeated by sweeping the magnetic field successively through each of a plurality of different microwave frequencies. The RF diode converts the power output from the RF probe to a voltage signal that is transmitted through an output cable 45 to the controller. Thereafter, the controller calculates $H_k$ and $\alpha$, and in some cases $\gamma$ and inhomogeneous broadening ($L_0$), based on each pair of applied magnetic field value and applied microwave frequency used to establish a FMR condition, and on voltage output data from the RF diode for each ($x_n$, $y_n$) coordinate used in the FMR measurement sequence.

Figure 1A:
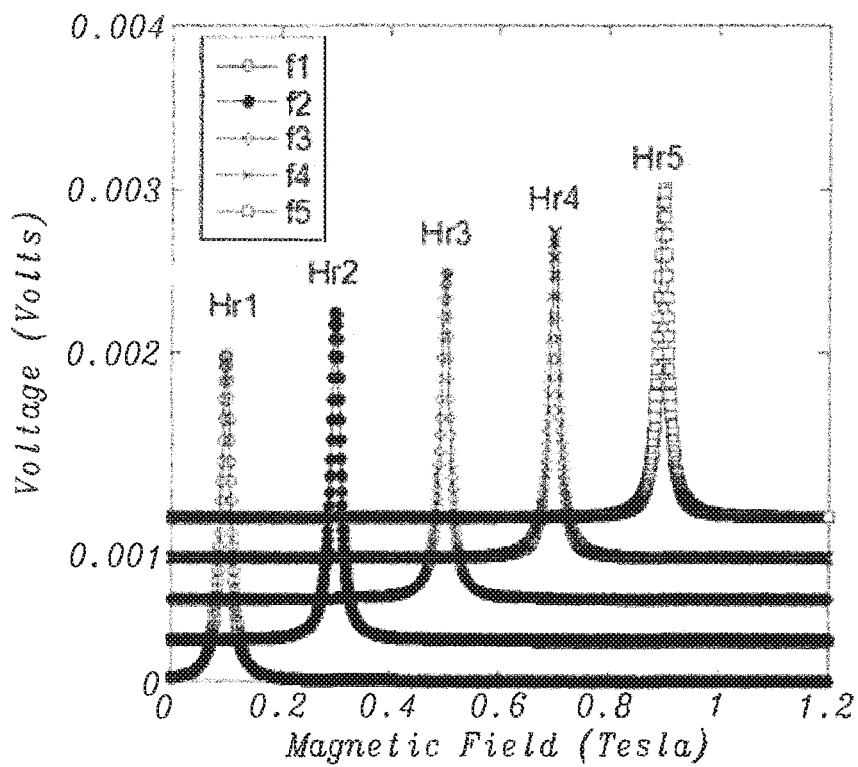
FIG. 1a shows a schematic description of the typical series of Lorentzian shaped peaks derived from ferromagnetic resonance measurements taken for 24 GHz to 48 GHz microwave frequencies.
Figure 1B:
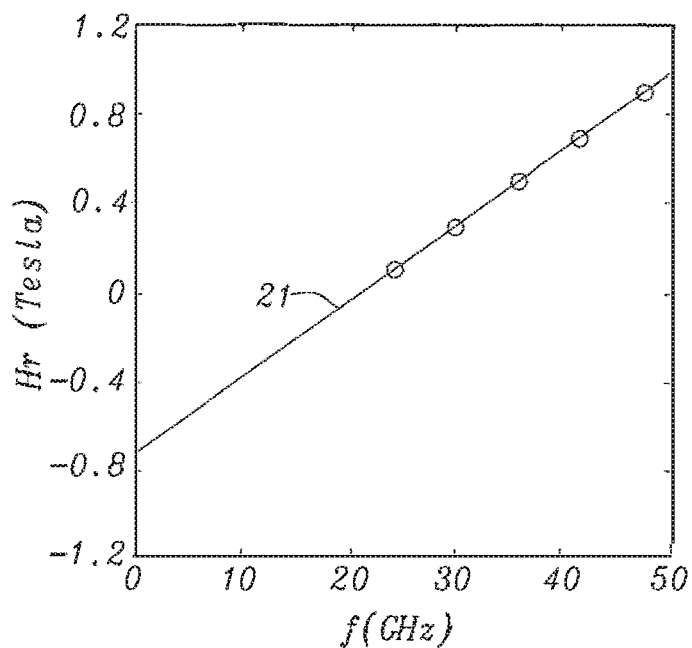
Figure 2:
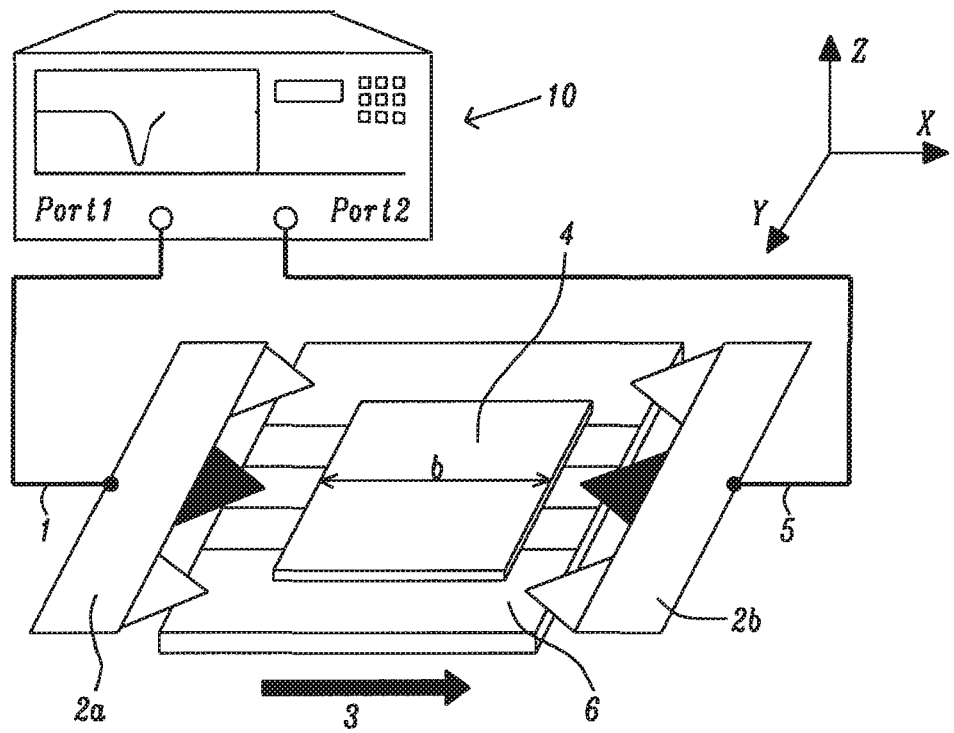
FIG. 2 is a diagram that illustrates a prior art FMR measurement scheme.

The present disclosure encompasses designs other than the one illustrated in FIG. 3 that may be employed to generate the microwave excitation (FMR condition) of a magnetic film sample, and detect the power absorption therein. For instance, a vector network analyzer (VNA) similar to the VNA 10 depicted in FIG. 2 may be used as a RF output generator and RF input analyzer. In another embodiment related to pulsed inductive microwave magnetometry (PIMM), a pulse generator and a time-resolved oscilloscope may serve as a RF source and RF analyzer, respectively. In yet another embodiment, a lock-in amplifier detection technique known to those skilled in the art may be employed to amplify the FMR output signal, which indicates the power loss from each FMR condition.

Figure 4:
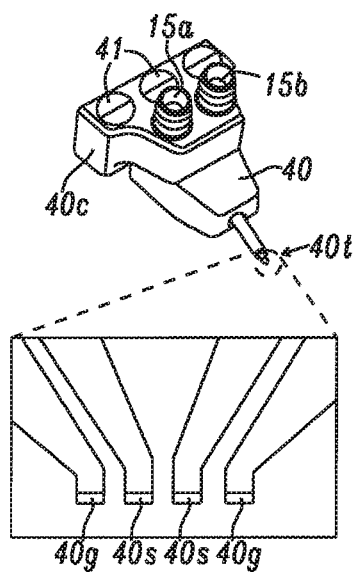
FIG. 4 is an oblique view of a RF probe that includes two sets of probes (two for ground and two for signals) that is part of the fully automated scanning FMR measurement system of the present disclosure.

Referring to FIG. 4, an oblique view of a commercially available RF probe 40 is depicted. The RF probe is attached to a chassis 40c by screws 41. First and second RF connectors 15a, 15b, respectively, that are attached to the RF probe are shown protruding from a top surface of the chassis. The RF probe tip 40t extends from a front face of the RF probe and in the exemplary embodiment has two sets of probes arranged in a GSSG pattern according to one embodiment where G probes 40g are ground pathways, and S probes 40s are signal pathways that each contact a top surface of a magnetic structure or film (not shown) to be tested. In some embodiments, the S and G probes have a diameter that is on the order of tens of microns, although a bottom portion thereof that contacts a top surface of the magnetic film may have a dimension proximate to 1 micron.

Figure 5:
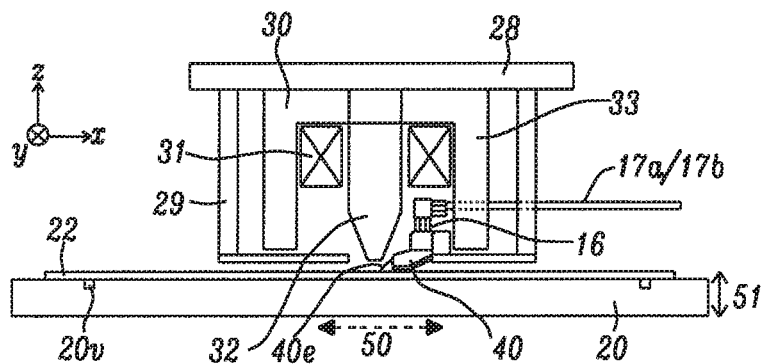
FIG. 5 is cross-sectional view of a magnetic assembly that is aligned over the RF probe in FIG. 4 during a FMR measurement of a film or magnetic structure on a wafer according to an embodiment of the present disclosure.

In FIG. 5, a cross-sectional view is shown of a portion of the scanning FMR measurement system comprised of the magnetic assembly that provides a magnetic field in a perpendicular-to-plane direction to a magnetic film at a test site that is an ($x_n$, $y_n$) coordinate (not shown) on WUT 22. There is a holder plate 28 that is attached to the RF probe 40 through a mounting bracket 29. A magnetic assembly 30 is also mounted below a top portion of the holder plate and in the exemplary embodiment comprises a magnetic pole 32 that is aligned above the RF probe tip, Cu coils 31 surrounding the magnetic pole, and magnetic return poles 33 adjacent to outer sides of the copper coils. Wafer chuck 20 has a plurality of holes 20v in a top surface thereof to allow a vacuum to be applied and hold the WUT 22 in position. The wafer chuck may move laterally 50 and vertically 51 between FMR measurements. RF input and output cables 17a, 17b, respectively, are connected to the RF probe through a 90° elbow connector 16 in the exemplary embodiment.

Figure 6:
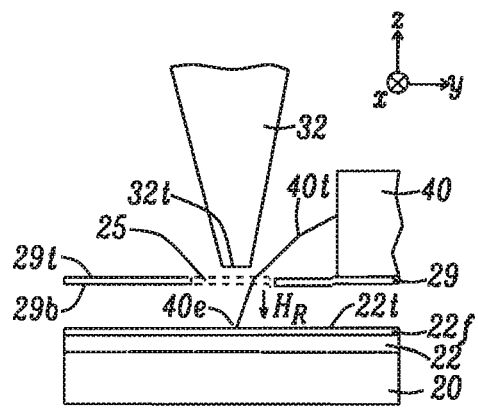
FIG. 6 shows an enlarged view of the magnetic pole tip in FIG. 5 that is positioned above a RF probe tip during a FMR measurement.

Referring to FIG. 6, an enlarged view of a portion of the scanning FMR measurement system in FIG. 5 is shown. Magnetic pole 32 has a pole tip 32t aligned above an opening 25 in mounting bracket 29, and above the end 40e of RF probe tip 40t that is comprised of two ground pathways 40g and two signal pathways 40s described earlier with respect to FIG. 4. In other embodiments, the pole tip may protrude through the opening but does not contact the RF probe tip or the magnetic film. A bottom side 29t of the mounting bracket faces a top surface 22t of a magnetic film 22f on the WUT 22. RF probe end 40e protrudes through opening 25, and makes contact with a portion of top surface 22t during a FMR measurement. The magnetic field $H_R$ is applied in a direction essentially perpendicular to top surface 22t at a selected ($x_n$, $y_n$) coordinate. RF frequencies employed for FMR measurements with this magnetic assembly are typically in the range of 1 to 100 GHz.

Figure 7:
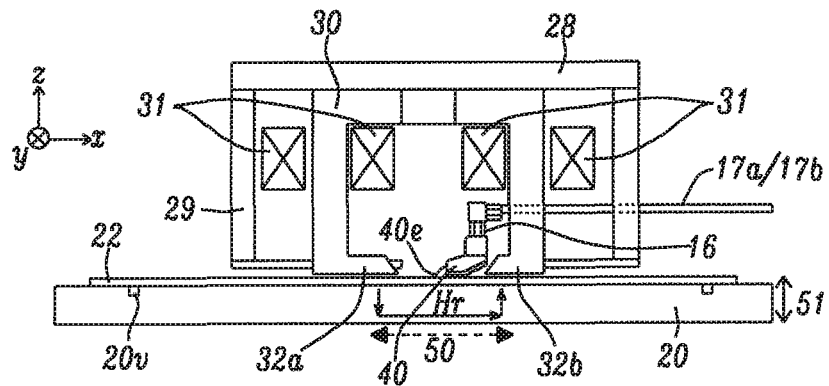
FIG. 7 is cross-sectional view of a magnetic assembly with two magnetic poles on opposite sides of a RF probe and providing an in-plane magnetic field during a FMR measurement according to an embodiment of the present disclosure.

Referring to FIG. 7, a second embodiment of the scanning FMR measurement system of the present disclosure is shown that retains all of the features of the previous embodiment except the magnetic assembly comprises two magnetic poles 32a, 32b that are each surrounded by Cu coils 31, and are positioned on either side of the RF probe tip 40e, and proximate to the WUT 22 but not touching the magnetic film (not shown). Here a first pole may apply the in-plane magnetic field $H_R$ while a second pole may serve as the return pole. Thus, the pole configuration produces a magnetic field $H_R$ in the plane of the magnetic film proximate to the ($x_n$, $y_n$) coordinate where the RF probe tip contacts the top surface thereof. Applied RF frequencies during FMR measurements for this magnetic assembly configuration may be in the range of 0.01 to 100 GHz.

Figure 8:
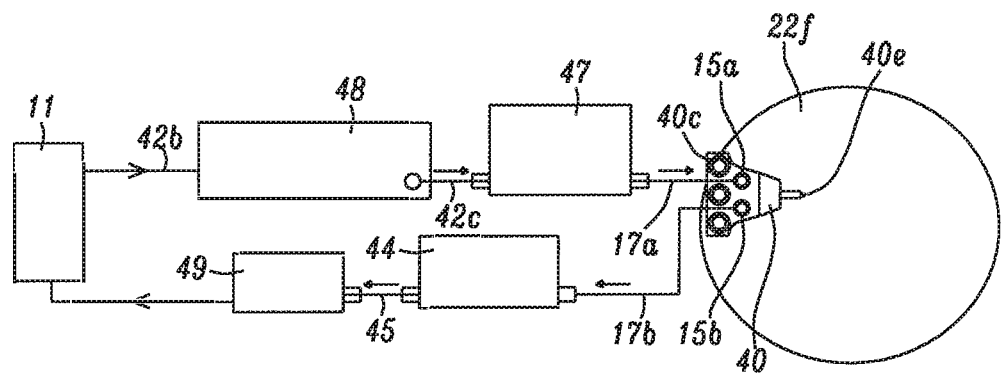
FIG. 8 is a layout of a RF source, RF diode, and other components of the RF measurement circuit that are connected to the RF probe above a wafer under test according to a transmission FMR measurement mode of the present disclosure.

Referring to FIG. 8, a schematic drawing of a scanning FMR measurement system configured for a RF signal transmission mode is depicted according to a first embodiment of the present disclosure. The magnetic assembly and holder plate are not shown in order to focus on the electrical layout. It should be understood that either of the magnetic assemblies having a single magnetic pole in FIGS. 5-6, or a dual magnetic pole (FIG. 7) may be employed with the RF transmission mode.

In the exemplary embodiment, controller 11 has a link 42b to a commercial RF generator 48 with capability to generate a range of frequencies mentioned previously. The RF generator is connected by link 42c to a frequency multiplier module 47 such as an active frequency doubler, which in turn is connected through RF input cable 17a to RF input connector 15a on RF probe 40. RF probe end 40e contacts magnetic film 22f during a FMR measurement when a magnetic field from at least one magnetic pole tip (not shown), and a RF frequency from a first signal pathway (40s in FIG. 4) in the RF probe tip are simultaneously applied to a region of the magnetic film proximate to the RF probe end. When the magnetic film is excited to a FMR resonance state, a RF output signal corresponding to a power loss passes through a second signal pathway to RF output connector 15b and then to RF output cable 17b to a RF diode 44 that may be a positive Schottky diode, for example, to prevent overvoltage stress. The RF output signal is then transmitted to an analog to digital converter (ADC) 49 before reaching the controller. According to one embodiment, the holder plate with magnetic assembly, and RF probe are installed on a commercial electrical probe station that is available from different vendors.

During intervals when no FMR measurements are being performed, the RF probe tip including end 40e is a gap distance>0 from the top surface 22t of the magnetic film 22f on WUT 22. As indicated previously, when the scanning FMR measurement system is programmed to perform a plurality of FMR measurements at a certain $(x_n, y_n)$ coordinate, the wafer chuck is raised so that the RF probe end contacts the magnetic film until the FMR measurements are completed. For the single pole embodiment (FIG. 6), it is important that the magnetic pole tip 32t is aligned over the $(x_n, y_n)$ coordinate where RF probe end makes contact with top surface 22t so that the same region proximate to the $(x_n, y_n)$ coordinate is exposed to both of the magnetic field $(H_R)$ and RF frequency $(f_R)$ required for each FMR measurement.

During a FMR measurement when a magnetic field is applied to an area around an $(x_n, y_n)$ coordinate on the magnetic film contacted by the RF probe end 40e, a portion of the microwave power supplied by the RF input signal is absorbed by the magnetic film 22f during a FMR condition so that the RF output signal carried through RF output cable 17b and through a RF power diode has reduced power compared with the RF input signal. The RF power diode may be a Schottky diode, or another commercial RF diode, and converts the RF output signal for each $(H_R, f_R)$ pair to a voltage measurement that is relayed to the controller. In other words, the intensity of the applied magnetic field $(H_R)$ may be varied for a given RF frequency $(f_R)$, or a plurality of RF frequencies may be applied with a constant magnetic field during each FMR measurement at an $(x_n, y_n)$ coordinate. Preferably, the applied magnetic field is swept from a minimum to a maximum value at a constant microwave frequency (F1), and then the FMR measurement is repeated by sweeping the magnetic field successively with each of a plurality of different microwave frequencies (F2, F3, . . . Fn). Once a plurality of FMR measurements is taken at a first $(x_n, y_n)$ coordinate, the wafer chuck and WUT are lowered and "stepped" to a second $(x_n, y_n)$ coordinate for a second set of FMR measurements. Thus, the scanning FMR measurement method described herein comprises taking multiple FMR measurements at a plurality of preprogrammed $(x_n, y_n)$ coordinates, and is managed by the controller 11.

Figure 9:
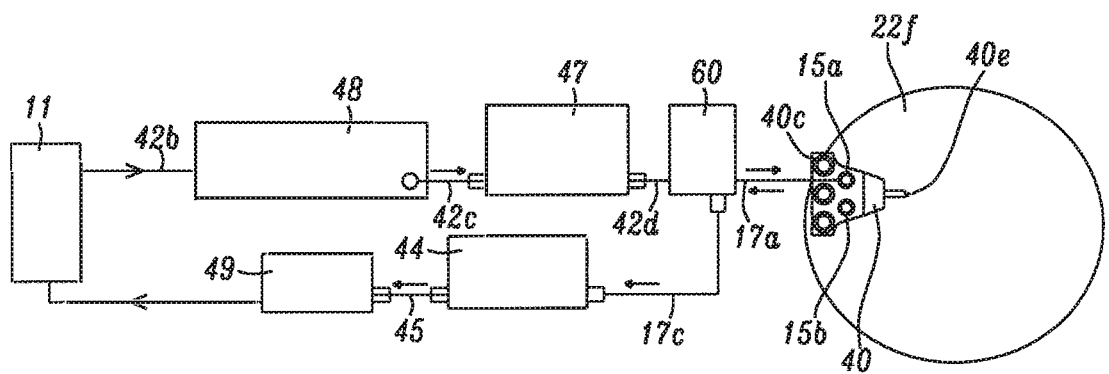
FIG. 9 is a layout of a RF source, RF diode, and directional coupler that are connected to the RF probe above a wafer under test according to a reflectance FMR measurement mode of the present disclosure.

According to a second embodiment shown in FIG. 9, the scanning FMR measurement system of the present disclosure is configured in a reflectance mode. The reflectance mode retains all of the features previously described for the transmission mode except only one signal pathway 40s is active in the RF probe 40. In other words, only one set of G and S pathways is electrically connected and the other set is inactive. Furthermore, according to a preferred embodiment, a directional coupler 60 is inserted between active frequency doubler (AFD) 47 and RF input cable 17a. Accordingly, a RF input signal travels from RF generator 48 through the frequency multiplier module such as the AFD as in the first embodiment. Then, the RF input signal passes through the directional coupler, RF input cable and, RF input connector 15a to RF probe end 40e.

A portion of the microwave power supplied by the RF input signal is absorbed by the magnetic film 22f proximate to a $(x_n, y_n)$ coordinate contacted by the RF probe end. In this case, the RF output signal is carried through the signal pathway 40s used for the input signal and through RF input connector 15a back to directional coupler 60 where the RF signal is routed through RF output cable 17c to Schottky diode 44 or another RF diode, and ADC 49 before reaching controller 11. In alternative embodiments, a power divider or a bias tee may be used instead of the directional coupler as appreciated by those skilled in the art.

As described earlier with respect to the transmission mode, the intensity of the applied magnetic field $(H_R)$ at the $(x_n, y_n)$ coordinate may be swept from a minimum to a maximum value for each in a series of frequencies F1, F2, and so forth up to Fn. Alternatively, the RF frequency may be swept from a minimum to a maximum value for each applied magnetic field in a series of increasing magnitudes from H1, H2, and so forth up to Hn. Once a plurality of FMR measurements is taken at a first $(x_n, y_n)$ coordinate, the wafer chuck and WUT are lowered and "stepped" to a second $(x_n, y_n)$ coordinate for a second series of FMR measurements. Thus, the scanning FMR measurement method of the second embodiment that is based on a RF reflectance mode comprises taking multiple FMR measurements at a plurality of preprogrammed $(x_n, y_n)$ coordinates on a magnetic film 22f. The Schottky diode 44 or another commercial RF diode, converts the RF output signal for each $(H_R, f_R)$ pair to a voltage measurement that is relayed to the controller through ADC 49.

The controller uses the FMR measurement data and one or more of equations (1)-(3) described previously to determine Hk, α, and in some cases γ and inhomogeneous broadening $(L_0)$ at each $(x_n, y_n)$ coordinate on the magnetic film. As indicated earlier, the term "magnetic film" may refer to a stack of layers in an unpatterned film, or in a plurality of devices having sub-millimeter or even sub-micron dimensions along the x-axis and y-axis directions. In all cases, there should be a conductive pathway through the magnetic film to enable a RF frequency (with an applied magnetic field) to induce a FMR condition in the magnetic film.

Figure 10:
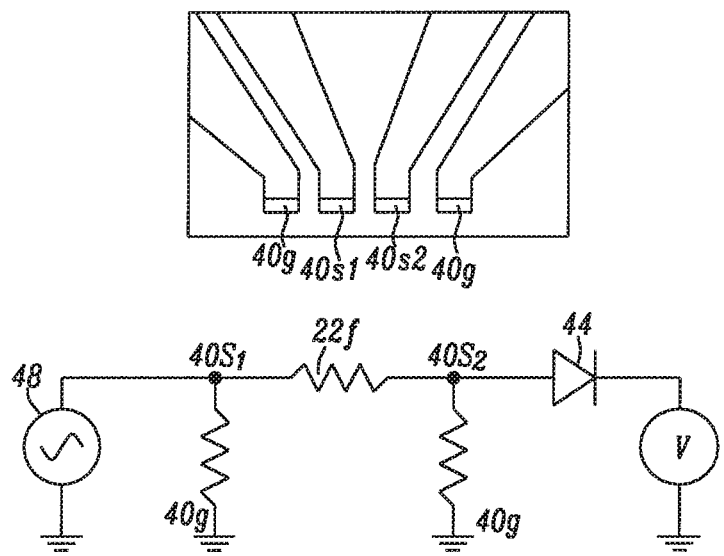
FIG. 10 shows a simplified equivalent DC circuit in a transmission FMR measurement mode according to an embodiment of the present disclosure.

Referring to FIG. 10, a simplified equivalent DC circuit of the connected device is illustrated for the transmission mode. The top portion of the drawing shows the end 40e of the probe tip where a first signal pathway $40s_1$ and a second signal pathway $40s_2$ are each flanked by a ground pathway 40g. The bottom portion of the drawing depicts RF generator 48 as a signal source, and a connection through pathway $40s_1$ to a resistor that represents a resistive current path through magnetic film 22f proximate to a $(x_n, y_n)$ coordinate. The output path is through second signal pathway $40s_2$ to Schottky diode 44 or another RF diode where a voltage signal is produced corresponding to the power loss during passage through the resistive current path.

Figure 11:
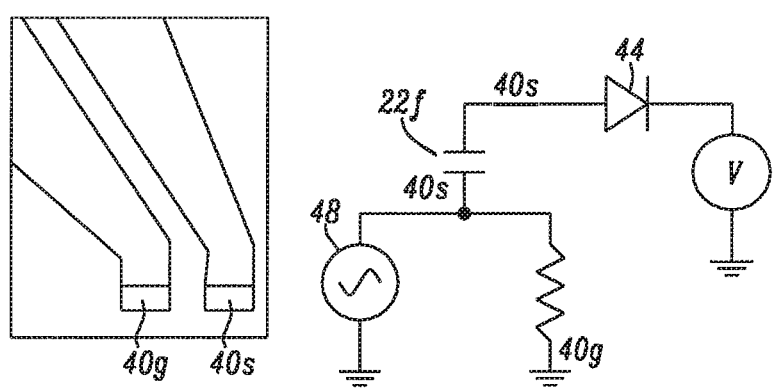
FIG. 11 shows a simplified equivalent DC circuit in a reflectance FMR measurement mode according to an embodiment of the present disclosure.

In FIG. 11, a simplified equivalent DC circuit of the connected device is illustrated for the reflectance mode. The left side of the drawing shows the end 40e of the probe tip where signal pathway 40s is adjacent to a ground pathway 40g. Note that only one of the two sets of 40g/40s pathways depicted in FIG. 4 is active during FMR measurements obtained by the reflectance mode. The right side of FIG. 11 depicts RF generator 48 and a connection through signal pathway 40s to a capacitor that represents a capacitive current path through the magnetic film 22f proximate to a certain $(x_n, y_n)$ coordinate. The output path is also through signal pathway 40s to a directional coupler and then through a Schottky diode 44 or the like where a voltage signal is produced that corresponds to the power loss during passage through the capacitive current path.

Figure 12:
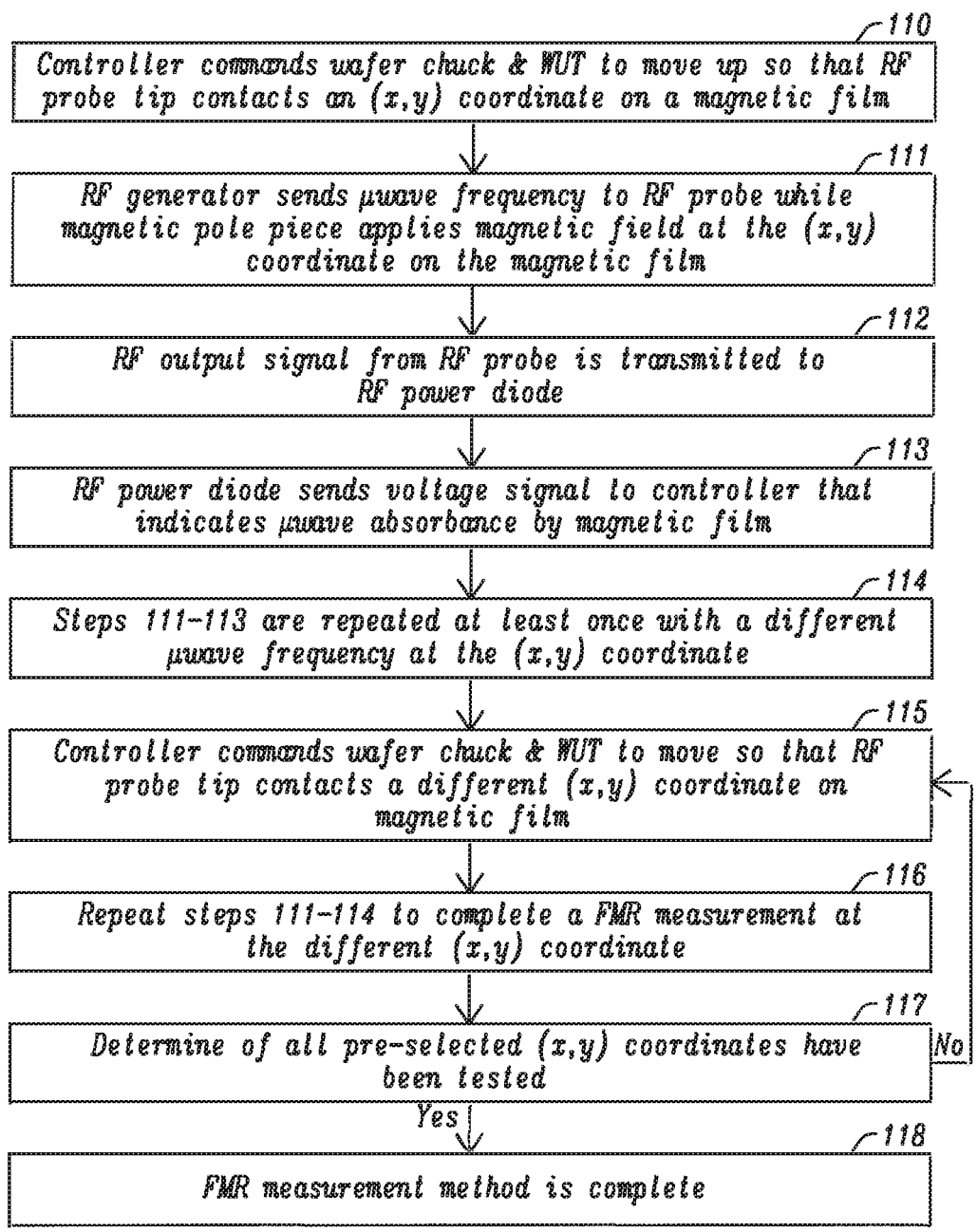
FIG. 12 is a flow chart that illustrates the sequence of steps used to make FMR measurements according to an embodiment of the present disclosure.

Referring to FIG. 12, a scanning FMR measurement method is illustrated in a flow diagram according an embodiment of the present disclosure, and may be employed for both of the transmission mode and reflectance mode embodiments, and with either of the magnetic assemblies described previously. In step 110, the controller commands (through link 42d in FIG. 3) the wafer chuck holding the WUT and uppermost magnetic film to move upwards (movement 51u in FIG. 3) such that a region proximate to a first $(x_n, y_n)$ coordinate on the magnetic film contacts RF probe end 40e (FIG. 6). Next, in step 111, the controller by way of another link 42b instructs the RF generator 48 to send a microwave frequency F1 through signal pathway 40s (FIG. 4) while an overlying magnetic pole piece described previously applies a magnetic field at the first $(x_n, y_n)$ coordinate. As mentioned earlier, the magnetic field is preferably swept from a minimum to a maximum value.

As a result of the simultaneous application of microwave frequency F1 and the variable magnetic field, the magnetic film achieves a FMR condition and absorbs a portion of the microwave power that depends on the magnetic properties of the magnetic film, the magnitude of F1, and the applied magnetic field $(H_R)$ that induced the ferromagnetic resonance state in the film. Accordingly, in step 112, the RF power diode detects a reduced power value in the RF output signal compared with the value specified by the controller in the RF input signal from step 111.

In step 113, the RF power diode converts the RF output signal to a voltage measurement that is transmitted to the controller (through an ADC in the exemplary embodiments in FIGS. 8, 9) and indicates the microwave absorbance by the magnetic film for the applied microwave frequency F1 and applied magnetic field $H_R$.

Step 114 comprises a repetition of steps 111-113 except the RF input signal has a second frequency F2 that is applied to the magnetic film at the previously selected $(x_n, y_n)$ coordinate after F1 is applied. In some embodiments, steps 111-113 are repeated a plurality of times at each $(x_n, y_n)$ coordinate used for the FMR measurement method. In other words, a third frequency F3 that differs from F1 and F2 may be applied during an interval of time after F2, and so forth up to an "nth" frequency Fn after F3 is applied. Note that the applied magnetic field is preferably swept between a minimum and a maximum value for each frequency F1 up to Fn. Thus, a FMR condition occurs with each applied frequency and with a certain magnetic field value, and each FMR condition has a unique microwave absorbance that is translated into a corresponding voltage signal by the RF power diode. In an alternative embodiment, the applied magnetic field is held constant at a first value H1 while the microwave frequencies are varied (swept) from F1 up to Fn to establish a FMR condition. Thereafter, a second magnetic field H2 that is different from H1 may be applied while the microwave frequencies are varied through a range of values. The scanning FMR measurement method may be repeated by sweeping through a range of RF frequencies with a different magnetic field up to a maximum Hn value.

Referring to step 115, the controller commands the wafer chuck and overlying magnetic film to move to a different $(x_n, y_n)$ coordinate such as from $(x_1, y_1)$ to $(x_2, y_2)$. The movement comprises a first step of disengaging the RF probe tip from the first $(x_n, y_n)$ coordinate with a downward movement of the wafer chuck and WUT (movement 51d in FIG. 3). Then, in a second step, there is a lateral movement of the wafer chuck and WUT (movement 50 in FIG. 5), and finally a third step of an upward movement of the wafer chuck and WUT so that the RF probe tip contacts a second $(x_n, y_n)$ coordinate on the magnetic film to be tested.

Thereafter, steps 111-114 are repeated to complete a FMR measurement at the second $(x_n, y_n)$ coordinate. Note that each $(x_n, y_n)$ coordinate may comprise a contact area of less than a square micron up to a plurality of square millimeters depending on the size of the signal probes 40s selected, and each $(x_n, y_n)$ coordinate may be a center point in the area contacted by the RF probe tip.

Depending on the diameter of the WUT that may be 6", 8", or 12", for example, and the number of different $(x_n, y_n)$ coordinates desired for FMR measurements, step 116 indicates that steps 111-115 may be repeated a plurality of times to yield a plurality of FMR measurements involving "n" different $(x_n, y_n)$ coordinates each with a plurality of $(H_R, f_R)$ pairs where $f_R$ is one of F1 up to Fn, and $H_R$ may be varied from a minimum H1 value to a maximum Hn value. At step 117, a decision is made whether or not all of the pre-selected $(x_n, y_n)$ coordinates on the magnetic film have been tested. If "no", another FMR measurement is taken at a different $(x_n, y_n)$ coordinate. If "yes", step 118 indicates the scanning FMR measurement method is complete.

As mentioned earlier, the controller is capable of determining magnetic properties in the magnetic film at each measurement location corresponding to a different $(x_n, y_n)$ coordinate. Each FMR measurement yields one or more pairs (frequency, field) also referred to as $(H_R, f_R)$ pairs in equation (1) corresponding to each FMR condition. The controller uses FMR measurement data and one or more of equations (1)-(3) described previously to determine Hk, $\alpha$, and in some cases $\gamma$ and inhomogeneous broadening $(L_0)$.

Figure 13:
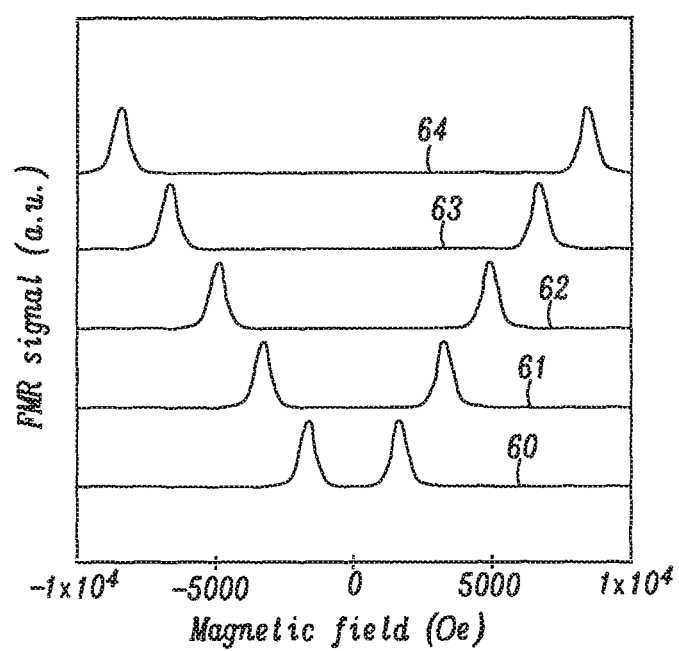
FIG. 13 is a plot of acquired data from the RF diode as a function of various applied magnetic fields at different RF frequencies according to an embodiment of the present disclosure.

Using the transmission mode embodiment described earlier, we performed FMR measurements on full (unpatterned) film structures. FIG. 13 depicts a typical data set. In this example, transmitted power is measured for five different frequencies as a function of the applied magnetic field on an uncut 8-inch diameter wafer (WUT). Curves 60, 61, 62, 63, and 64 are generated with RF frequencies of 20 GHz, 25 GHz, 30 GHz, 35 GHz, and 40 GHz, respectively, and sweeping the magnetic field between -1.0 Tesla and 1.0 Tesla (10000 Oe) according to a scanning FMR measurement method of the present disclosure. The FMR measurement at each $(x_n, y_n)$ coordinate required about two minutes of process time. Total FMR measurement time for the entire wafer depends on the desired number of $(x_n, y_n)$ coordinates to be included in the FMR measurement sequence.

All components required for assembling a scanning FMR measurement system for either the transmission mode or reflectance mode embodiments described herein are commercially available. The cross-sectional area of the device structures, or the area of unpatterned magnetic films that may be tested with a scanning FMR measurement scheme of the present disclosure are substantially smaller than in the prior art. Moreover, the magnetic assembly described previously enables a more uniform magnetic film to be applied thereby yielding more reliable FMR measurements than conventional methods.

While this disclosure has been particularly shown and described with reference to the preferred embodiment thereof, it will be understood by those skilled in the art that various changes in form and details may be made without departing from the spirit and scope of this disclosure.

What is claimed is:

1. A scanning ferromagnetic resonance (FMR) measurement system for determining magnetic properties in a magnetic film or in a plurality of device structures that are formed on a wafer under test (WUT), comprising:
   a RF probe linked to a microwave (RF) generator and having at least a probe tip wherein at least one signal pathway contacts the magnetic film or plurality of device structures during a FMR measurement;
   a magnetic assembly comprised of at least one magnetic field source that provides a magnetic field proximate to the RF probe tip which together with a simultaneous application of a microwave frequency from the RF generator is configured to induce a first FMR condition in the magnetic film or plurality of device structures;
   a detection system for monitoring microwave absorbance and a corresponding power loss by the magnetic film or plurality of device structures when the first FMR condition therein is established wherein the WUT is configured to move laterally and vertically relative to the RF probe such that the probe tip contacts the magnetic film or plurality of devices at one or more predetermined locations during a FMR measurement sequence; and
   a controller to manage the simultaneous application of the microwave frequency and magnetic field, the WUT movement, and to receive a signal from the detection system, wherein the signal is converted to an output comprised of one or more magnetic properties.

2. The scanning FMR measurement system of claim 1 wherein the RF probe and magnetic assembly are attached to a holder plate, and are held stationary while the WUT is moved during the FMR measurement sequence.

3. The scanning FMR measurement system of claim 1 wherein the RF probe and magnetic assembly are attached to a holder plate, and are moved while the WUT is stationary during the FMR measurement sequence.

4. The scanning FMR measurement system of claim 1 that is configured in a transmission mode wherein a RF input signal from the RF generator passes through a first signal pathway in the RF probe tip to the magnetic film or plurality of magnetic devices, and a second signal pathway in the RF probe transmits a RF output signal from the magnetic film or plurality of magnetic devices to a RF diode in the detection system.

5. The scanning FMR measurement system of claim 1 that is configured in a reflectance mode wherein a RF input signal from the RF generator passes through a first signal pathway in the RF probe to the magnetic film or plurality of magnetic devices, and the first signal pathway also transmits a RF output signal from the magnetic film or plurality of magnetic devices to a RF diode in the detection system.

6. The scanning FMR measurement system of claim 1 wherein the detection system comprises a RF diode that converts the RF output signal to a voltage signal, and an analog-to-digital converter between the RF diode and the controller.

7. The scanning FMR measurement system of claim 1 wherein the magnetic assembly has a single magnetic pole that is aligned above the RF probe tip, and applies the magnetic field in a perpendicular-to-plane direction at each of the one or more predetermined locations during the FMR measurement sequence.

8. The scanning FMR measurement system of claim 7 wherein the applied microwave frequency is in a range of 1 to 100 GHz.

9. The scanning FMR measurement system of claim 1 wherein the magnetic assembly has two magnetic poles that are positioned on opposite sides of the RF probe tip, and apply the magnetic field in an in-plane direction at each of the one or more predetermined locations during the FMR measurement sequence.

10. The scanning FMR measurement system of claim 9 wherein the applied microwave frequency is in a range of 0.01 to 100 GHz.

11. The scanning FMR measurement system of claim 5 further comprised of a directional coupler that directs the RF input signal to the RF probe, and is employed to isolate the RF output signal from the RF probe, which is transmitted to the RF diode and then to the controller.

12. The scanning FMR measurement system of claim 1 wherein the RF probe and magnetic assembly are installed in an electrical probe station.

13. The scanning FMR measurement system of claim 1 wherein the controller is programmed to repeat the simultaneous application of a microwave frequency and a magnetic field at each of the one or more predetermined locations thereby inducing at least a second FMR condition, wherein at least one of the microwave frequency and magnetic field is different from the microwave frequency and magnetic field used to induce the first FMR condition.

14. A system comprising:
   a probe configured to apply one or more microwave frequency values to one or more locations on a magnetic material;
   a magnetic field source configured to apply one or more magnetic field values to the one or more locations on the magnetic material which together with the application of the one or more microwave frequency values from the probe establishes one or more ferromagnetic resonance conditions at the one or more locations on the magnetic material thereby resulting in a RF output signal for each pair of an applied microwave frequency value and an applied magnetic field value;
   a RF diode configured to receive RF output signals and convert each RF output signal to a voltage signal; and
   a controller configured to receive each voltage signal from the RF diode and determine one or more properties of the magnetic material based on each received voltage signal.

15. The system of claim 14, wherein the magnetic field source includes a magnetic pole that is aligned above a tip of the probe and is configured to apply the one or more magnetic fields in a perpendicular-to-plane direction at each of the one or more locations on the magnetic material.

16. The system of claim 14, wherein the magnetic field source includes at least two magnetic poles that are positioned on opposite sides of a tip of the probe and are configured to apply the one or more magnetic fields in an in-plane direction at each of the one or more locations on the magnetic material.

17. The system of claim 14, wherein the one or more microwave frequency values are in a range of about 0.01 to about 100 GHz, and wherein the magnitude of the one or more magnetic field values is up to 3 Tesla.

18. A system comprising:
- a RF probe configured to apply one or more microwave frequencies to one or more locations on a magnetic material;
- a magnetic field source configured to provide a magnetic field proximate to the RF probe which together with an application of a microwave frequency from the RF probe is configured to induce a first ferromagnetic resonance condition in the magnetic material;
- a detection system for monitoring microwave absorbance and a corresponding power loss by the magnetic material when the first FMR condition therein is established and thereby output a voltage signal based on the microwave absorbance and the corresponding power loss by the magnetic material when the first FMR condition therein is established; and
- a controller configured to manage the application of the microwave frequency and magnetic field and to receive the voltage signal from the detection system, the controller further configured to determine one or more properties of the magnetic material based on the received voltage signal.

19. The system of claim 18, wherein the detection system includes a Schottky diode.

20. The system of claim 18, wherein the magnetic field source has two magnetic poles that are positioned on opposite sides of the RF probe to provide the magnetic field proximate to the RF probe.

\* \* \* \* \*